(12) United States Patent
Nagarkar et al.

(10) Patent No.: US 9,090,967 B1
(45) Date of Patent: Jul. 28, 2015

(54) MICROCOLUMNAR LANTHANUM HALIDE SCINTILLATOR, DEVICES AND METHODS

(75) Inventors: Vivek Nagarkar, Weston, MA (US); Valeriy Gaysinskiy, Allston, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 178 days.

(21) Appl. No.: 13/460,626

(22) Filed: Apr. 30, 2012

Related U.S. Application Data

(63) Continuation-in-part of application No. 12/721,505, filed on Mar. 10, 2010.

(60) Provisional application No. 61/480,325, filed on Apr. 28, 2011.

(51) Int. Cl.
*C23C 14/24* (2006.01)
*G01T 1/202* (2006.01)

(52) U.S. Cl.
CPC .................. *C23C 14/24* (2013.01); *G01T 1/202* (2013.01)

(58) Field of Classification Search
CPC ...... C23C 14/243; C23C 14/24; C23C 16/08; G01T 1/202; G21K 4/00
See application file for complete search history.

(56) References Cited

U.S. PATENT DOCUMENTS

| | | | |
|---|---|---|---|
| 4,668,480 A | 5/1987 | Fujiyashu et al. | |
| 7,504,634 B2 | 3/2009 | Shah | |
| 7,612,342 B1 | 11/2009 | Nagarkar | |
| 8,674,311 B1 | 3/2014 | Nagarkar et al. | |
| 2002/0017245 A1* | 2/2002 | Tsubaki et al. | 118/718 |
| 2005/0082484 A1 | 4/2005 | Srivastava et al. | |
| 2005/0285041 A1 | 12/2005 | Srivastava et al. | |
| 2006/0197023 A1 | 9/2006 | Srivastava et al. | |
| 2007/0051896 A1 | 3/2007 | Okada et al. | |
| 2007/0205371 A1 | 9/2007 | Inoue | |
| 2008/0083877 A1 | 4/2008 | Nomura et al. | |
| 2008/0286461 A1 | 11/2008 | Noguchi et al. | |
| 2009/0008561 A1 | 1/2009 | Nagarkar et al. | |
| 2009/0050811 A1 | 2/2009 | Barrett et al. | |
| 2010/0034351 A1 | 2/2010 | Yanagita et al. | |
| 2010/0230601 A1 | 9/2010 | Martins Loureiro et al. | |

OTHER PUBLICATIONS

U.S. Appl. No. 12/721,505, filed Mar. 10, 2010, Nagarkar et al.
U.S. Appl. No. 13/460,705, filed Apr. 30, 2012, Nagarkar.
Babla et al., "A triple-head solid state camera for cardiac single photon emission tomography," Proc. of SPIE 6319:63190M 1-5 (2006).
Bartzakos & Thompson, "A PET detector with depth-of-interaction determination," Phys. Med. Biol. 3 6(6): 735-748 (1991).
Burr et al., "Evaluation of a prototype small-animal PET detector with depth-of-interaction encoding," IEEE Trans. NucL Sci. 51(4):1791-1798 (2004).
Derenzo et al., "Initial characterization of a position-sensitive photodiode/BGO detector for PET," IEEE Trans. NucL Sci. 36(1):1-6 (1989).

(Continued)

*Primary Examiner* — David Porta
*Assistant Examiner* — Yara B Green
(74) *Attorney, Agent, or Firm* — Wilson Sonsini Goodrich & Rosati

(57) ABSTRACT

Evaporation methods and structures for depositing a microcolumnar lanthanum halide scintillator film on a surface of a substrate. A radiation detection device including a doped lanthanum halide microcolumnar scintillator formed on a substrate.

16 Claims, 7 Drawing Sheets

(56) References Cited

OTHER PUBLICATIONS

Gramsch, "Measurement of the depth of interaction of an LSO scintillator using a planar process ADP," IEEE Trans. on NucL Sci. 50 (3):307-312 (2003).

Huber et al., "An LSO scintillator array for a PET detector module with depth of interaction measurement," IEEE Trans. Nucl. Sci. 48:684-688 (2001).

Inadama et al., "A Depth of Interaction Detector for PET with GSO Crystals doped with Different amount of Ce," IEEE, 1099-1103 (2002).

Karp & Daube-Witherspoon, "Depth-of-interaction determination in NaI(T1) and BGO scintillation crystals using a temperature gradient," Nucl. Instr. Methods Phys. Res. A260:509-517 (1987).

Knoll, "Pulse Shape Discrimination," in: Radiation Detection and Measurement, Third Edition, Glenn F. Knoll, John Wiley & Sons, NY, p. 646 (2000).

Knoll, "Specialized Detector Configurations Based on Scintillation," in: Radiation Detection and Measurement, Second Edition, John Wiley & Sons, NY, p. 344-345 (1989).

Kupinski and Barrett, Small-Animal SPECT Imaging, Springer Science+Business Media Inc. (2005).

Ling et al., "Depth of interaction decoding of a continuous crystal detector module," Phys. Med. Biol. 52:2213-2228 (2007).

MacDonald & Dahlbom, "Depth of interaction for PET using segmented crystals," IEEE Trans. Nucl. Sci. 45(4):2144-2148 (1998).

Miyaoka et al., "Design of a depth of interaction (DOI) PET Detector Module," IEEE Trans. on Nucl. Sci. 45(3):1069-1073 (1998).

Moisan et al., "Segmented LSO crystals for depth-of-interaction encoding in PET," IEEE Trans. Nucl. Sci. 45(6):3030-3035 (1998).

Murayama et al., "Design of a depth of interaction detector with a PS-PMT for PET," IEEE Trans. Nucl. Sci. 47(3):1045-1050 (2000).

Nagarakar at al., "Development of microcolumnar Labr3:Ce scintillator," Proc. of SPIE 7450:745006-1-745006-10 (2009).

Nagarakar et al., "Microcolumnar and polycrystalline growth of LaBr3:Ce scintillator," Nucl. Instr. And Meth. A (2010), doi:10.1016/j.nima.2010.06.190.

Saoudi at al., "Investigation of depth-of-interaction by pulse shape discrimination in multicrystal detectors read out by avalanche photodiodes," IEEE Trans. Nucl. Sci. 46(3):462-467 (1999).

Schramm et al., High-resolution SPECT using multi-pinhole collimation, IEEE Trans. Nucl. Sci. 50(3):774-777 (2003).

Seidel et al., "Depth identification accuracy of a three layer phoswich PET detector module," IEEE Trans. Nucl. Sci. 46(3):485-490 (1999).

Shah at al., "LcC13:Ce scintillator for y-ray detection," Nucl. Instr. And Meth. Phys. Res. A 505: 76-81 (2003).

Shao et al., "Dual APD array readout of LSO crystals: optimization of crystal surface treatment," IEEE Trans. Nucl. Sci. 49(3):649-654 (2002).

Smith et al., "Design of multipinhole collimators for small animal SPECT," IEEE NSS/MIC Conference Records (2004).

Stahle et al., "Fabrication of CdZnTe strip detectors for large area arrays," SPIE 3115:90-97 (1997).

Streun et al., "Pulse shape discrimination of LSP and LuYAP scintillators for depth of intereaction detection in PET," IEEE Trans. Nucl. Sci. 50(3):344-347 (2003).

Tornai et al., Comparison of compact gamma cameras with 1.3- and 2 0-mm quantized IEEE Trans. Nucl. Sci. 52(5):1251-1256 (2005).

Yamamoto & Ishibashi, "A GSO depth of interaction detector for PET," IEEE Trans. NucNucl.Sci. 45(3): 1078-1082 (1998).

Yamashita et al., "High resolution block detectors for PET," IEEE Trans. Nucl. Sci. 37(2):589-593 (1990).

\* cited by examiner

MICROCOLUMNAR LANTHANUM HALIDE SCINTILLATOR, DEVICES AND METHODS

CROSS-REFERENCES TO RELATED APPLICATIONS

The present application is a continuation-in-part of U.S. application Ser. No. 12/721,505, filed Mar. 10, 2010, and claims priority to U.S. Provisional Application No. 61/480,325, filed Apr. 28, 2011, the full disclosures of which are incorporated herein by reference.

The present application is related to U.S. application Ser. No. 12/721,489, filed on Mar. 10, 2010, and U.S. application Ser. No. 12/721,462, filed on Mar. 10, 2010, issued as U.S. Pat. No. 8,084,742, the full disclosures of which are incorporated herein by reference.

BACKGROUND OF THE INVENTION

The present invention relates to hot wall scintillator fabrication methods and scintillators. More specifically, the present invention provides microcolumnar lanthanum halide scintillators. Related devices and methods of using the scintillators described herein are also provided.

Scintillation spectrometers are widely used in detection and spectroscopy of energetic photons (e.g., X-rays and γ-rays). Such detectors are commonly used, for example, in nuclear and particle physics research, medical imaging, diffraction, non destructive testing, nuclear treaty verification and safeguards, nuclear non-proliferation monitoring, and geological exploration.

Important requirements for the scintillation materials used in these applications include high light output, transparency to the light it produces, high stopping efficiency, fast response, good proportionality, low cost and availability in large volume. These requirements are often not met by many of the commercially available scintillators. While general classes of chemical compositions may be identified as potentially having some attractive scintillation characteristic(s), specific compositions/formulations and structures having both scintillation characteristics and physical properties necessary for actual use in scintillation spectrometers and various practical applications, as well as capability of imaging at a high resolution, have proven difficult to predict or produce. Specific scintillation properties are not necessarily predictable from chemical composition alone, and preparing effective scintillators from even candidate materials often proves difficult. For example, while the composition of sodium chloride had been known for many years, the invention by Hofstadter of a high light-yield and conversion efficiency scintillator from sodium iodide doped with thallium launched the era of modern radiation spectrometry. More than half a century later, thallium doped sodium iodide, in fact, still remains one of the most widely used scintillator materials. Since the invention of NaI(Tl) scintillators in the 1940's, for half a century radiation detection applications have depended to a significant extent on this material. As the methodology of scintillator development evolved, new materials have been added, and yet, specific applications, particularly those requiring high resolution imaging and large volumes, are still hampered by the lack of scintillators suitable for particular applications.

As a result, there is continued interest in the search for new scintillator formulations and physical structures with both the enhanced performance and the physical characteristics needed for use in various applications. Today, the development of new scintillators continues to be as much an art as a science, since the composition of a given material does not necessarily determine its performance and structural properties as a scintillator, which are strongly influenced by the history (e.g., fabrication process) of the material as it is formed. While it is may be possible to reject a potential scintillator for a specific application based solely on composition, it is not possible to predict whether a material with promising composition will produce a scintillator with the desired properties.

Thus, a need exists for improved scintillator compositions and structures, including improved lanthanum halide scintillators, suitable for use in various radiation detection applications, as well as improved methods of fabricating thin scintillator films is a more cost-effective manner.

BRIEF SUMMARY OF THE INVENTION

The present invention provides microcolumnar lanthanum halide scintillators, related devices and methods, as well as unique evaporation-based methods and structures for fabricating scintillators. The scintillators of the invention are useful in a variety of applications, including, for example, spectroscopy detection of energetic photons (x-rays and gamma-rays) and imaging applications (e.g., x-ray imaging, PET, SPECT, etc.).

In one aspect, the present invention provides a method of forming a microcolumnar lanthanum halide scintillator film on a surface of a substrate. The method can include providing a hot wall evaporation apparatus comprising an evaporation chamber having one or more chamber walls disposed between a positioned substrate and a scintillator source material; and depositing a microcolumnar lanthanum halide scintillator film on a surface of the positioned substrate by a process comprising applying heat to the evaporation chamber so as to vaporize scintillator source material for film deposition, wherein applying heat comprises maintaining a temperature relationship of $T_{wall} > T_{source} > T_{substrate}$ for at least a portion of the deposition process. In some embodiments, the present invention includes a microcolumnar lanthanum halide scintillator film made by the hot wall evaporation techniques described herein.

In yet another aspect, the present invention provides a hot wall evaporation apparatus for depositing a microcolumnar lanthanum halide scintillator film on a surface of a substrate. The apparatus can include an evaporation chamber having a first end with a substrate holder, a second end with one or more scintillator source material boats, and one or more chamber walls at least partially disposed between the first and second ends; and a heating system coupled to the evaporation chamber and configured to apply heating to the chamber so as to vaporize a scintillator source material positioned in the one or more boats so as to deposit a microcolumnar lanthanum halide scintillator film on a surface of a substrate positioned in the holder, the applied heating comprising a temperature relationship of $T_{wall} > T_{source} > T_{substrate}$.

For a fuller understanding of the nature and advantages of the present invention, reference should be had to the ensuing detailed description taken in conjunction with the accompanying drawings. The drawings represent embodiments of the present invention by way of illustration. The invention is capable of modification in various respects without departing from the invention. Accordingly, the drawings/figures and description of these embodiments are illustrative in nature, and not restrictive.

DETAILED DESCRIPTION OF THE INVENTION

Figure 1:
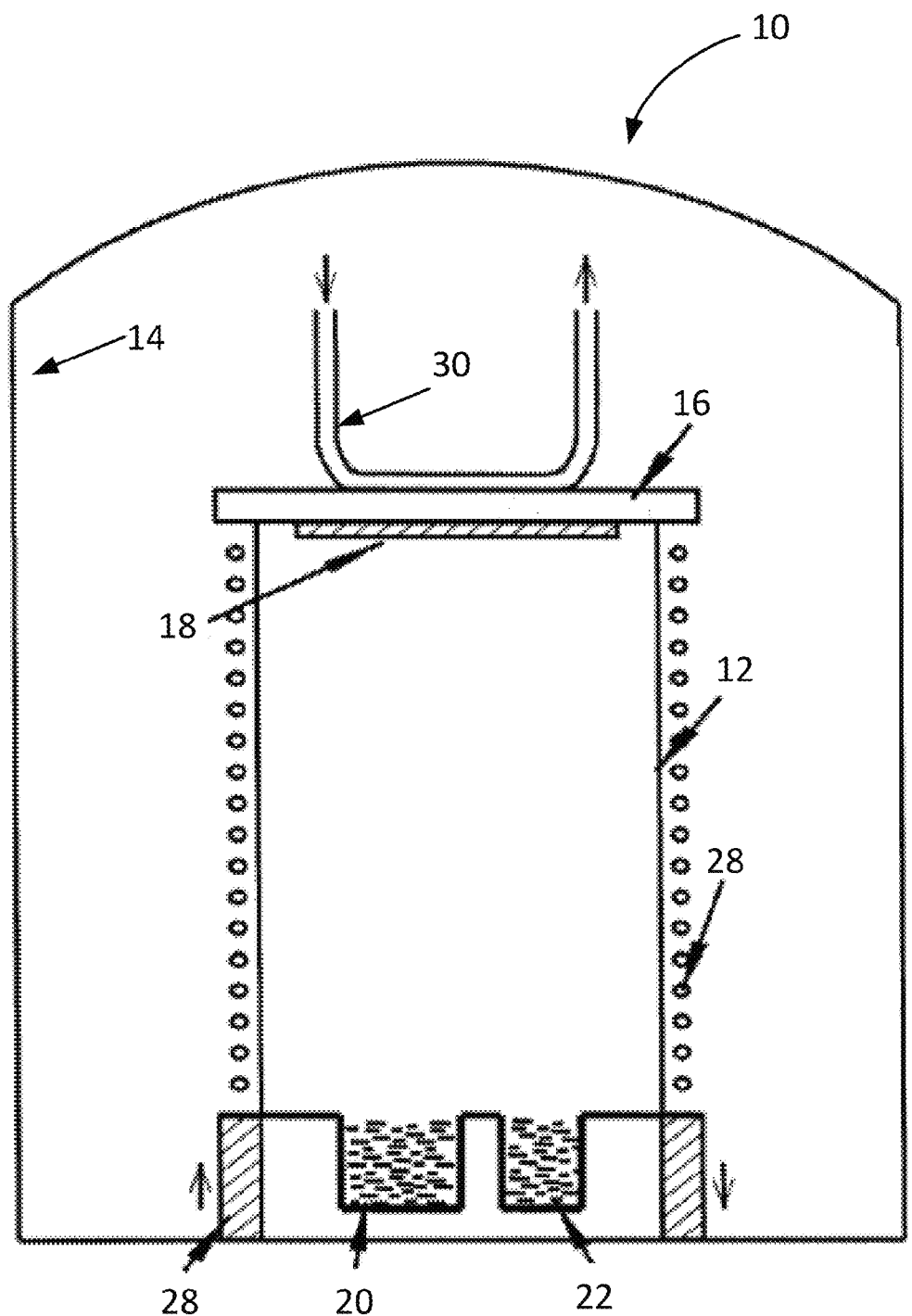
FIG. 1 illustrates an evaporation apparatus according to an embodiment of the present invention.

The present invention relates to hot wall scintillator fabrication methods and scintillators. More specifically, the present invention provides microcolumnar lanthanum halide scintillators made using hot wall evaporation methods. Related devices and methods of using the scintillators described herein are also provided.

The present invention includes methods and structures for fabricating the scintillators described herein. In some embodiments, the scintillators described herein can be grown using a vapor deposition technique, co-evaporation in a hot wall evaporation (HWE) apparatus. In certain embodiments, the hot wall evaporation techniques can include hot wall epitaxial growth of the scintillators described herein. Hot wall evaporation techniques, as described herein, include a vacuum deposition technique where scintillator film is efficiently deposited on a surface of a substrate. In one embodiment, the HWE apparatus includes a chamber or cylinder positioned in a vacuum, heated, with an evaporation source "boat" or reservoir at one end (typically the bottom in an upright positioned chamber) and a temperature controlled substrate at the other (typically the top in an upright positioned chamber). In certain embodiments, the disclosed methods make use of salts and vapor deposits them, e.g., simultaneously, on a suitable substrate using two independent sources. Under different deposition conditions, the material grows in the desired form. In one embodiment, two source boats are used to accomplish co-evaporation of a salt and a dopant salt for deposition of a scintillator film on a substrate surface. In some embodiments, the HWE techniques can include three or more source boats. Each boat can contain a particular source material (a.k.a. charge) of interest to produce the scintillators described herein. The source boats can be positioned separate (e.g., laterally spaced) from each other.

For HWE, the heated cylinder wall serves to enclose, deflect and effectively direct the vapor from the source to the substrate where molecules are deposited with a shallow impinging angle. With the substrate being the coolest part in the system (e.g., compared to the cylinder wall and source material), molecules adhere solely or primarily to the substrate and do not substantially accumulate on the hot walls, making efficient use of the source material. To ensure thermodynamic equilibrium the relationship between the substrate temperature and that of the source and the heated wall should be: $T_{wall} > T_{source} > T_{substrate}$. After deposition, the deposited scintillator material can be annealed in a variety of atmospheric conditions. Annealing can be used to enhance the performance of the scintillators described herein.

The HWE techniques described herein further advantageously allow preservation of stoichiometry during the deposition process, even where the source material(s) include compounds having relatively large differences in vapor pressures and sticking coefficients. This may be due to the fact that the HWE takes place under conditions of thermodynamic equilibrium, which allows the high vapor pressures of various compounds to be maintained. As a result, the dissociation of various constituents does not present a problem for scintillator deposition as described herein. As a matter of fact, the interaction of components with each other on the substrate surface can lead, under favorable growth conditions, to the formation and growth of the compound. Thus, HWE is particularly advantageous for applications including depositing thick films using two sources—a main component charge and a dopant charge, where the two source materials differ by orders of magnitude in their vapor pressure. For deposition of doped lanthanum halides, for example, HWE will preserve the stoichiometry in the deposited material, such as $LaCl_3$:Ce or $LaBr_3$:Ce.

Deposition of microcolumnar films involves methods where the evaporated material be incident on the substrate at a grazing angle. HWE creates this condition through minimized mean free path for the vaporized molecules due to the large density of evaporated material, and through efficient reflection of molecules from walls, which are maintained at the highest temperature in the setup. Thus, the thermodynamic equilibrium and atmosphere conducive to growth created by the HWE process allows deposition of stoichiometrically balanced films with well-separated columnar morphology.

Another aspect of HWE is its high (close to 100%) deposition efficiency, as the substrate is the coldest part of the evaporation environment. As a result, vapors that impinge on HWE system parts, including the hot walls, are deflected and mostly condense only on the relatively cool substrate. Consequently, material loss is at a minimum, enhancing the deposition efficiency to 95% or more (and greatly simplifying apparatus cleaning and maintenance).

A valuable aspect of HWE described herein, particularly in thick film deposition, is that the growth rate is an order of magnitude higher than that of conventional systems. For a one-component system the deposition rate is proportional to the impingement rate ($\emptyset$) of atoms on the substrate at constant temperature, and is governed by the equation:

$$\emptyset = n(kT/2\pi m)^{1/2}$$

where n is the number of evaporant molecules per unit volume, m is the mass of the molecule, k is the Boltzmann constant, and T is the source temperature. For hot wall epitaxy of $LaCl_3$:Ce this equation still holds, since the vapor phases of constituent compounds are in equilibrium with the source material. Therefore, the deposition process is basically very similar to that for a single element. As the source temperature T is very high and the substrate is the coldest part in the evaporator, the impingement rate of molecules and hence the film growth rate can be an order of magnitude higher than the conventional systems. The growth rate is related to the impingement rate by the following equation:

$$\text{Growth rate} = \{\emptyset * \text{Avg thickness of the } LaCl_3\text{:Ce monolayer}\}/\text{The surface density of } LaCl_3\text{:Ce}.$$

The process of material growth consists of a series of events that begin with the physical adsorption of a fraction of the incident molecules on the substrate or by forming a stable nucleus by interaction with the other adsorbed molecules. This process of nucleation and growth is typical for the formation of a film of one material on a substrate of a different material. In HWE no nucleation takes place, but growth occurs by direct adsorption of the molecules on low energy sites, such as kinks on an atomic ledge. Under these conditions, even when the growth rate is very high, a mono-layer by mono-layer deposition (epitaxial) growth is obtained resulting in excellent crystallinity of films with superior optical transmission properties.

A HWE apparatus, according to one embodiment of the present invention is described with reference to FIG. 1. The apparatus 10 includes a hot wall deposition chamber 12 illustrated positioned in a vacuum chamber 14 in an upright positioning, having a top portion and a bottom portion. The top portion includes a substrate holder 16, with a deposition substrate 18 illustrated coupled with the holder 16. The bottom portion includes source material areas or source boats, with a main component (e.g., $LaBr_3$) charge in a first boat 20 and a dopant charge (e.g., $CeBr_3$) in a second boat 22. The apparatus 10 further includes a heating system configured to achieve the $T_{wall} > T_{source} > T_{substrate}$ relationship during the deposition process. The heating system in the illustrated embodiment includes heating elements 28 (e.g., heater electrodes) coupled with the source boats 20, 22, chamber wall heating elements 28 (e.g., resistive heating elements), and a substrate heating/cooling system 30.

Component temperature ranges for use of the apparatus of FIG. 1 in fabrication of LaBr3:Ce, as an illustrative example, are described. The melting point of LaBr3 is about 783° C. Therefore, the LaBr3 source temperature can be in the range of about 820° C. to 980° C. The CeBr3 melting point is 720° C., therefore, the CeBr3 source temperature should be in the range of 750° C. to 870° C. The wall temperature should be in range of 860° C. to 1175° C., and the substrate temperature should be 200° C. to 650° C. The temperature relationship of apparatus components will be maintained as described above. In some embodiments, Amorphous Microcolumnar Structure™ scintillators can be produced with a substrate temperature between about 200° C. to about 450° C. In certain embodiments, Crystalline Microcolumnar Structure™ scintillators can be produced with a substrate temperature between about 450° C. to about 650° C.

To a high-vacuum vapor deposition system with, for example, a 24 inch diameter stainless steel bell jar, roughing pumps and a high vacuum cryo pump, vacuum gauges, two evaporation boats, the necessary power supplies, feed-throughs, and crystal monitors are added a HWE column with appropriate heaters and a water-cooled substrate holder. The walls of the column can be heated using a conformal resistive heater.

The films can be grown on a variety of substrate surfaces, including, for example, a transparent glass plate, which can be borosilicate glass or fused silica, but not soda-lime glass, which has a UV cutoff at 300-350 nm. Scintillator material may be grown directly on a para-xylylene polymer coating or layer, which may be disposed on another substrate surface. In depositing the material, the process can advantageously allow for controlling the dopant (Ce) concentration within deposited films; controlling thickness uniformity (e.g., above 99.5%) over the entire area for uniform detection efficiency and scintillation response; maximizing the optical transmission of the resultant material for improved light collection efficiency; maintaining excellent film adhesion to the substrate; optionally achieving a gradient of dopant in the resulting scintillator. The scintillator material can have a different lattice structure from that of the substrate.

In one embodiment of a high-vacuum-based HWE system, as shown in FIG. 1, source materials are co-evaporated using two boats. This approach minimizes difficulties in achieving the proper chemical composition of the deposited material arising from large differences in the vapor pressures of a main component charge and the dopant charge. In the embodiment illustrated in FIG. 1, the source boats and the chamber walls are coupled to heating elements that may provide heating to the substrate. In some instances, the substrate may be heated above the required temperature due to conductive and radiative heat from the wall and the source and, as such, a substrate cooling system may optionally be included. In one example, a cooler can include a Cu substrate holder with a liquid circulation channel coupled to a Neslab chiller.

Figure 2:
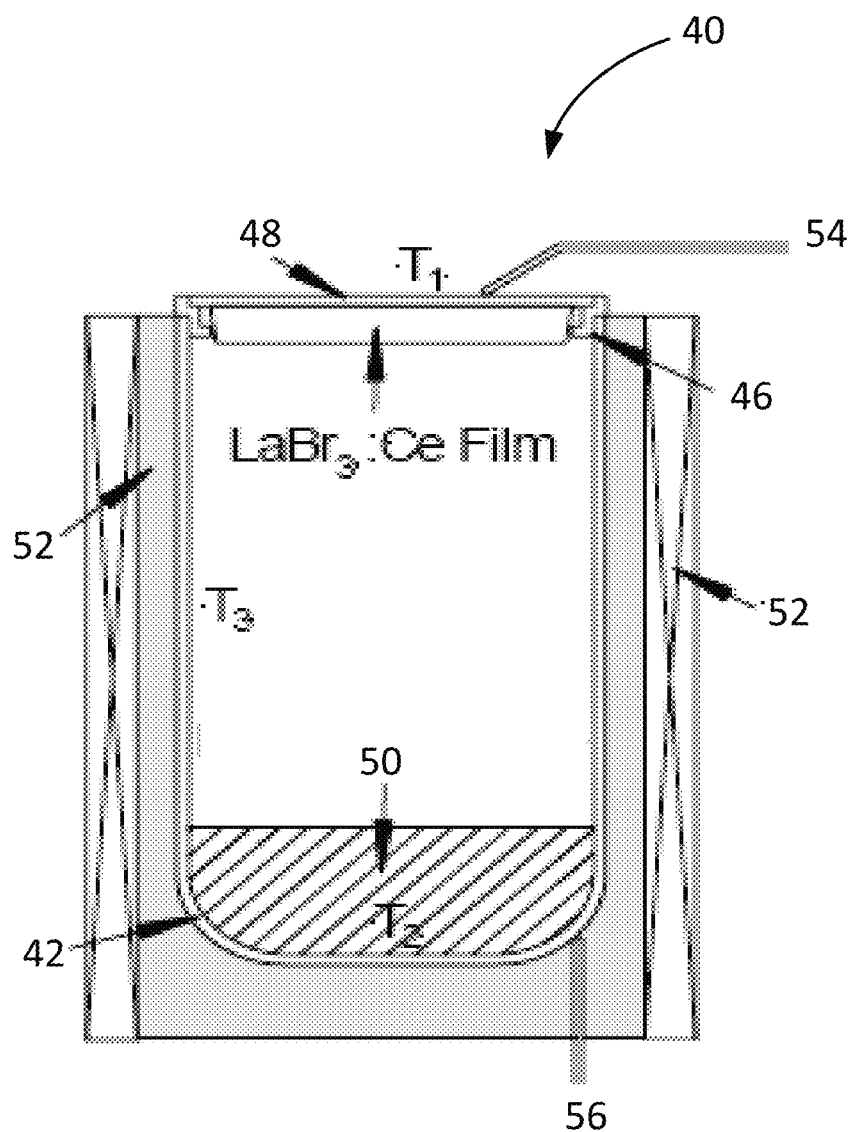
FIG. 2 illustrates an evaporation apparatus according to another embodiment of the present invention.

A hot wall evaporation apparatus, according to another embodiment of the present invention, is described with reference to FIG. 2. The apparatus 40 includes an evaporation chamber 42 having a top portion and a bottom portion, with chamber wall(s) 44 disposed therebetween. The top portion includes a substrate holder 46 holding a substrate 48, and the bottom portion includes a source reservoir 50 or boat. The apparatus 40 includes a resistive heating system 52 coupled to the chamber to apply heating. During deposition, the heating system 52 is activated to maintain the temperature relationship of $T_{wall} > T_{source} > T_{substrate}$ for at least a portion of the deposition process. The system 52 can include a feedback-type monitoring or temperature control system to maintain the desired temperature relationship, and may include one or more thermocouples 54, 56.

Figure 3:
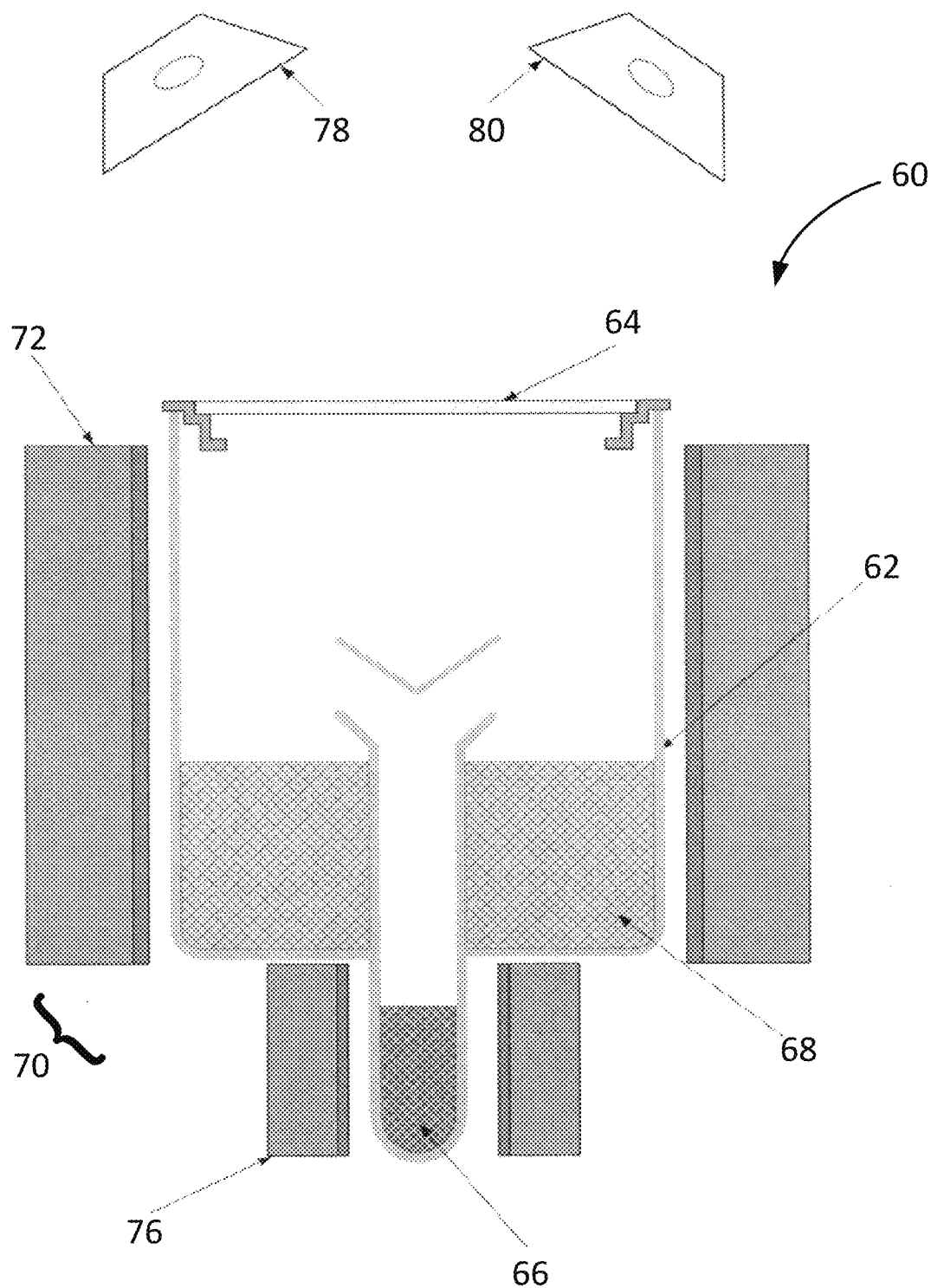
FIG. 3 illustrates an evaporation apparatus according to yet another embodiment of the present invention.

FIG. 3 illustrates a hot wall evaporation apparatus according to yet another embodiment. The apparatus 60 includes an evaporation chamber 62 with a substrate holder 64 at a top portion and source material boats at a bottom portion. The source boats include a first boat 66 (e.g., dopant charge boat) positioned within a second boat 68 (e.g., main component charge boat). As illustrated, the first boat 66 extends axially through the second boat 68, with a bottom portion of the first boat 66 extending below a bottom portion of the evaporation chamber or second boat 68. The apparatus 60 includes a heating system 70, including main heaters 72, 74 extending along the walls of the chamber 62 and positioned so as to heat the chamber walls and source material within the second boat 68. Heating of a substrate positioned in the holder 64 may occur due to heating from the main heater. The heating system 70 further includes a heater(s) 76 coupled to the first boat, and can further optionally include substrate heaters 78, 80. As above, the heating system is activated to maintain the temperature relationship of $T_{wall} > T_{source} > T_{substrate}$ for at least a portion of the deposition process.

The methods and structures described herein can be used to make a variety of scintillator compositions. For example, the present invention provides lanthanum halide scintillators. Halides can include fluoride, chloride, bromide and/or iodide. Lanthanum halide-based scintillator compositions (e.g., $LaBr_3$ or $LaCl_3$) are provided.

The scintillator compositions of the present invention can optionally include a "dopant." In certain embodiments, the scintillators described herein will typically include a dopant. Dopants can affect certain properties, such as physical properties (e.g., brittleness, etc.) as well as certain scintillation properties (e.g., afterglow, etc.) of the scintillator composition. The dopant can include, for example, europium (Eu), praseodymium (Pr), cerium (Ce), thallium (Tl), terbium (Tb), and mixtures of any of the dopants. The amount of dopant present will depend on various factors, such as the application for which the scintillator composition is being used; the desired scintillation properties (e.g., emission properties, timing resolution, etc.); and the type of detection device into which the scintillator is being incorporated. For example, the dopant is typically employed at a level in the range of about 0.1% to about 20%, by molar weight. In some embodiments, the amount of dopant is in the range of about 0.1% to about 100%, or about 0.1% to about 5.0%, or about 5.0% to about 20%, by molar weight. In one embodiment, lanthanum halide scintillators can include $LaBr_3$:Pr or $LaCl_3$:Ce scintillator compositions.

The scintillators described herein (e.g., $LaBr_3$:Pr and $LaCl_3$:Ce scintillators) can be produced in a variety of different forms. For example, the scintillators described herein can be polycrystalline or crystalline. In certain embodiments, the scintillators described herein can be microcolumnar scintillators. In some embodiments, the scintillators described herein are in the form of a polycrystalline film. In some embodiments, scintillators can be produced as transparent or translucent scintillators that include a crystalline or polycrystalline layer(s).

The scintillators described herein can be produced in a variety of thicknesses and spatial areas. Thicknesses of the films can be designed for certain imaging applications. For example, thin films (e.g., less than 20 mm) can be used to detect alpha particles, while limiting interference from detection of gamma rays. Thickness of the films can also be tailored to detect, for example, gamma rays, while also allowing for sufficient light transmission. Spatial resolution for, e.g., microcolumnar scintillators, can also be tailored by thickness of the films. In some embodiments, scintillators can be produced as a thin film, e.g., films having a thickness ranging from about 10 mm to about 1 cm. In certain embodiments, the scintillators can be thick films having a thickness of 1 cm or greater, and can be referred to as "slabs." In some embodiments, scintillators can have thickness of less than about 20 microns, less than about 500 microns, or less than about 1 cm. In certain embodiments, the scintillators can have a thickness greater than about 1 cm, greater than about 3 cm, or greater than about 5 cm. The scintillators described herein can be freestanding films, e.g., where the deposited film can be removed from the substrate after deposition. The scintillators can be deposited over small to wide areas on the order, for example, of $mm^2$ or $cm^2$ (e.g., up to $50 \times 50\, cm^2$). Diameters of columns in the microcolumnar lanthanum halide scintillators can have a wide range, for example from tens of microns (e.g., about 1 to 30 microns) to hundreds of microns (e.g., 500 microns) or larger.

Scintillator compositions and assemblies of the present invention can further include one or more reflective coatings, e.g., formed on a substrate surface or otherwise coupled with a scintillator. In one embodiment, a reflective coating can be formed on a substrate surface prior to deposition of the scintillator, such as in the case of opaque substrates. One embodiment includes the use of substrates such as alumina that are themselves white in color and act as an excellent reflector. Another embodiment includes the use of substrates that are themselves photodetectors (e.g., SSPMs, amorphous silicon arrays, CCDs, and CMOS devices). For graphite-like substrates, reflective metal coatings can be formed. In addition to being highly reflective, such coatings may be required to withstand high process temperatures, maintain adhesion to the substrate during and after deposition, and/or be chemically inert with the scintillator or suitable for coating with a chemically inert material, such as an organic polymer or resin (e.g., Parylene C). For transparent substrates a reflective coating can be applied atop the scintillator film directly or after deposition of one or more other coatings, such as a Parylene coating. As noted above, various coating technologies can be utilized for forming coatings with the required optical and/or protective properties.

As set forth above, scintillator compositions of the present invention may find use in a wide variety of applications. In one embodiment, for example, the invention is directed to a method for detecting energetic (e.g., ionizing) radiation (e.g., gamma-rays, X-rays, neutron emissions, alpha particles, beta particles and the like) with high energy resolution using a detector based on a scintillator described herein. In certain embodiments, the microcolumnar form of scintillators described herein can be used for high spatial resolution imaging.

Figure 4:
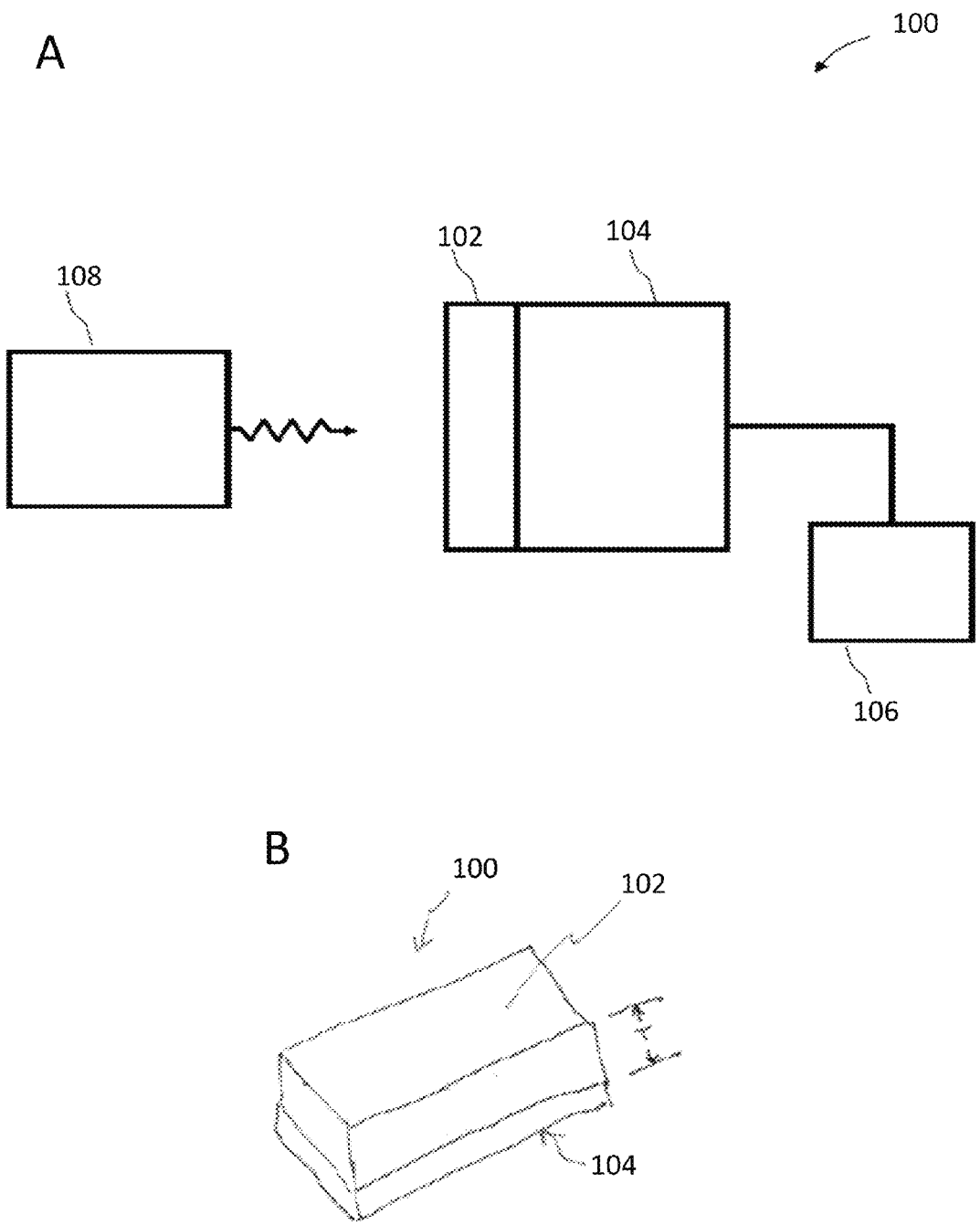
FIG. 4A is a conceptual diagram of a radiation detection system of the present invention.
FIG. 4B is a diagram of a scintillator composition disposed on a substrate, according to an embodiment of the present invention.

FIG. 4A is a diagram of a radiation detection system or apparatus including a scintillator of the present invention. The detector system 100 includes a scintillator 102 optically coupled to detector assembly 104 including a light photodetector assembly or imaging device. The detector assembly of system 100 can include a data analysis or computer system 106 (e.g., data acquisition and/or processing device) to process information from the scintillator 102 and detector assembly/photodetector 104. In use, the detector 100 detects energetic radiation emitted form a source 108.

A system as in FIG. 4A containing the scintillator composition (scintillator 102) of the present invention is optically coupled to the detector assembly 104 (e.g., photodetector) and can include an optical window that can be disposed, e.g., at one end of the enclosure-casing. The window permits radiation-induced scintillation light to pass out of the scintillator composition assembly for measurement by the photon detection assembly or light-sensing device (e.g., photomultiplier tube, etc.), which is coupled to the scintillator assembly. The light-sensing device converts the light photons emitted from the scintillator into electrical pulses or signal that are output and may be shaped, digitized, or processed, for example, by the associated electronics.

A data analysis, or computer, system thereof can include, for example, a module or system to process information (e.g., radiation detection information) from the detector/photodetectors in an invention assembly and can include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in tangible media such as a memory, a digital or optical recording medium, optical, electrical, or wireless telemetry signals, or the like, and one or more of these structures may also be used to transmit data and information between components of the system in any of a wide variety of distributed or centralized signal processing architectures.

The detector assembly typically includes material formed from the scintillator compositions described herein (e.g., $LaBr_3$:Pr or $LaCl_3$:Ce scintillators). The detector further can include, for example, a light detection assembly including one or more photodetectors. Non-limiting examples of photodetectors include photomultiplier tubes (PMT), photodiodes, PIN detectors, charge coupled device (CCD) sensors, image intensifiers, avalanche detectors and the like. Choice of a particular photodetector will depend in part on the type of radiation detector being fabricated and on its intended use of the device. In certain embodiments, the photodetector may be position-sensitive. Detectors can further include imaging devices that can acquire images at high frame rates, such as frame rates that are faster than about 30 frames per second, about 100 frames per second, or about 1000 frames per second.

The detector assemblies themselves, which can include the scintillator and the photodetector assembly, can be connected to a variety of tools and devices, as mentioned previously. Non-limiting examples include nuclear weapons monitoring and detection devices, well-logging tools, and imaging devices, such as nuclear medicine devices (e.g., PET). Various technologies for operably coupling or integrating a radiation detector assembly containing a scintillator to a detection device can be utilized in the present invention, including various known techniques. In certain embodiments, the radiation detector comprises a scintillator described herein formed on a substrate that is optically coupled to the photodetector. Similarly, scintillator screens including a scintillator described herein can be included in a radiation detector such that the screen is optically coupled to the photodetector.

The detectors may also be connected to a visualization interface, imaging equipment, or digital imaging equipment (e.g., pixilated flat panel devices). In some embodiments, the scintillator may serve as a component of a screen scintillator. Energetic radiation, e.g., X-rays, gamma-rays, neutron, originating from a source, would interact with the scintillator and be converted into light photons, which are visualized in the developed film. The film can be replaced by amorphous silicon position-sensitive photodetectors or other position-sensitive detectors, such as avalanche diodes and the like. In some embodiments, neutrons can be indirectly detected by coupling (e.g., incorporating into or contacting) an absorbing converter material, such as but not limited to lithium, boron or gadolinium, into/with a scintillator described herein, and then detecting emissions (e.g., X-rays and/or alpha particles) produced by interactions between the neutrons and the absorbing converter material.

The methods of the present invention further include methods of performing radiation detection. The methods of performing radiation detection can include providing a detection device comprising a scintillator composition including a scintillator described herein; and a photodetector assembly operably (e.g., optically) coupled to the scintillator composition; and positioning the device such that a radiation source is within a field of view of the scintillator composition so as to detect emissions from the source. Emissions from the source can include x-rays, gamma-rays, neutrons, alpha particles, beta particles, or a combination thereof. In certain embodiments, a material (e.g., a patient, plant, animal, object, liquid, or gas) can be positioned between the radiation source and the scintillator composition. In some embodiments, the radiation source includes a material (e.g., a patient, plant, animal, object, liquid, or gas). In another embodiment, a material of interest (e.g., a patient, plant, animal, object, liquid, or gas) may scatter energetic radiation to the scintillator. The methods of radiation detection may also include X-ray and gamma ray astronomy and cosmic ray detection (e.g., in salt mines).

Imaging devices, including medical imaging equipment, such as PET and SPECT (single-photon emission computed tomography) devices, and the like, represent other potential applications for the invention scintillator compositions and radiation detectors. Furthermore, geological exploration devices, such as well-logging devices, were mentioned previously and represent an important application for these radiation detectors. The assembly containing the scintillator usually includes, for example, an optical window at one end of the enclosure/casing. The window permits radiation-induced scintillation light to pass out of the scintillator assembly for measurement by the photon detection assembly or light-sensing device (e.g., photomultiplier tube, etc.), which is coupled to the scintillator assembly. The light-sensing device converts the light photons emitted from the scintillator into electrical pulses that may be shaped and digitized, for example, by the associated electronics. By this general process, gamma rays can be detected, which in turn provides an analysis of geological formations, such as rock strata surrounding the drilling bore holes.

In applications of a scintillator composition, including those set forth above (e.g., nuclear weapons monitoring and detection, imaging, and well-logging and PET technologies), certain characteristics of the scintillator are desirable, including its light output (higher is can be preferred), rise time (faster can be preferred) and decay time (shorter can be preferred), timing shape (e.g., fixed or varying, depending upon dopant concentration used to analyze scintillation events), energy resolution (finer/lower % can be preferred), spatial resolution (finer, e.g., higher, can be preferred), and suitable physical properties. The present invention is expected to provide scintillator materials which can provide the desired high light output and initial photon intensity characteristics for demanding applications of the technologies. Furthermore, the scintillator materials are also expected to be produced efficiently and economically, and also expected to be employed in a variety of other devices which require radiation/signal detection (e.g., gamma-ray, X-ray, neutron emissions, and the like).

EXAMPLES

Example 1

High Conversion Efficiency Large-Area Microcolumnar Lanthanum Halide Scintillator Films This example demonstrates fabrication of $LaBr_3$:Ce scintillators in a microcolumnar form. The hot wall evaporation techniques can be used to fabricate scintillators in hours, whereas crystal growth requires days to weeks. Also, large area fabrication can be done for polycrystalline or columnar films in over, e.g., 40×40 $cm^2$ area. Thicknesses can be controlled from under 100 microns to over 2 cm with consistent thickness uniformity. Fine intrinsic segmentation in columnar films is achievable. For example, 1 to 30 micron column diameters yield improved spatial resolution.

Figure 5:
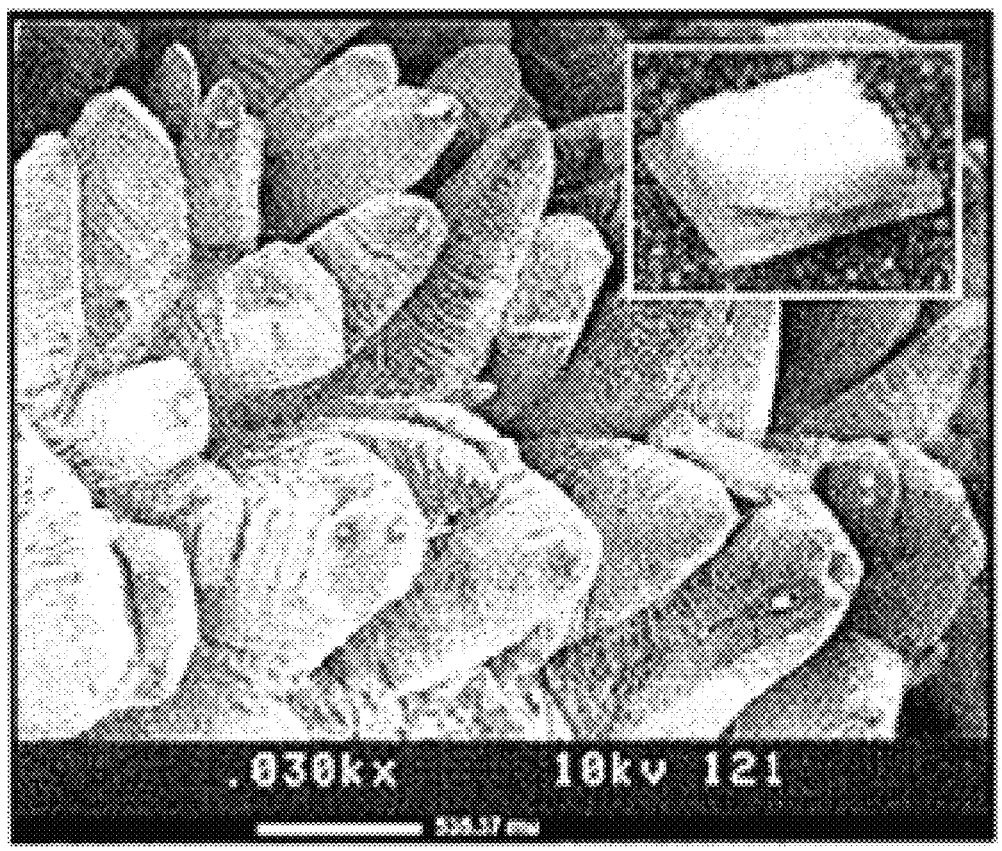
FIG. 5 illustrates a scanning electron microscopy image of a microcolumnar $LaBr_3$:Ce film, according to an embodiment of the present invention.

For columnar scintillator films, the columnar structure channels and conserves scintillation light through total internal reflection and suppresses lateral light spread. Film thickness can be tailored to provide high absorption for incident gamma rays, with minimal degradation in spatial resolution. FIG. 5B is an scanning electron microscopy image of a microcolumnar $LaBr_3$:Ce scintillator film. Light yield measurements using a $^{241}$Am 60 keV source were compared for an $LaBr_3$:Ce microcolumnar film produced using hot wall evaporation. As shown in Table 1 below, the 7 cm, 1 mm $LaBr_3$:Ce microcolumnar film exhibited a relative light yield of 1.46 as compared to 1.00 for a commercial crystal of $LaBr_3$:Ce and 0.90 for a microcolumnar film of $CeBr_3$ produced using hot wall evaporation.

TABLE 1

Light yield comparison of scintillators

| Specimen | Size (Diameter, Thickness) | Light Yield (Relative) |
|---|---|---|
| $LaBr_3$:Ce - Commercial crystal* | 1 cm, 1.3 cm | 1.00 |
| $LaBr_3$:Ce - RMD HWE microcolumnar film | 7 cm, 1 mm | 1.46 |

TABLE 1-continued

Light yield comparison of scintillators

| Specimen | Size (Diameter, Thickness) | Light Yield (Relative) |
|---|---|---|
| CeBr$_3$ - RMD HWE microcolumnar film | 7 cm, 1 mm | 0.90 |

*BrilLanCe ® 380 scintillation material data sheet, Saint-Gobain Crystals (Hiram, OH)

Figure 6:
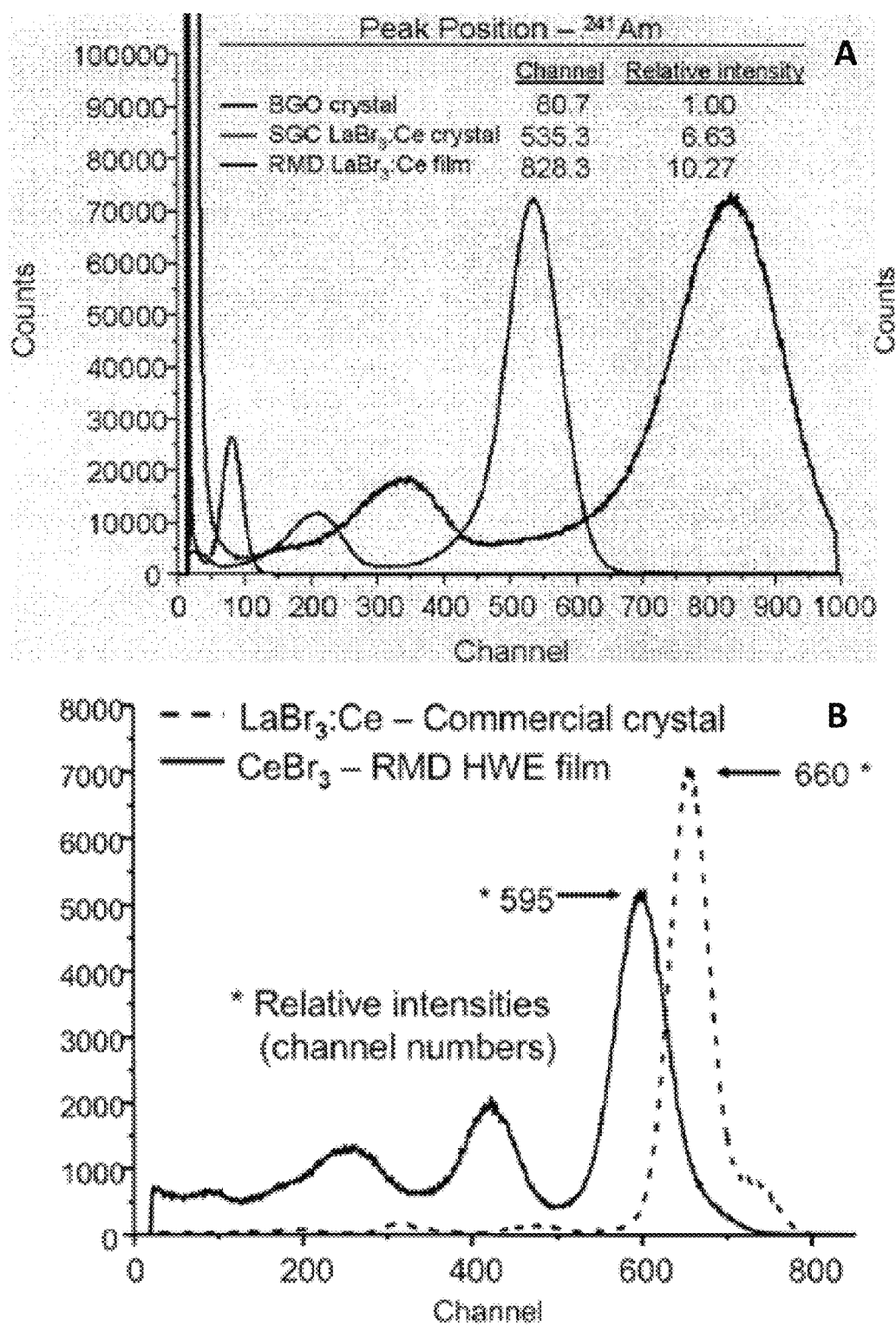
FIG. 6 shows light yield measurements of a $LaBr_3$:Ce film, according to an embodiment of the present invention.
Figure 7:
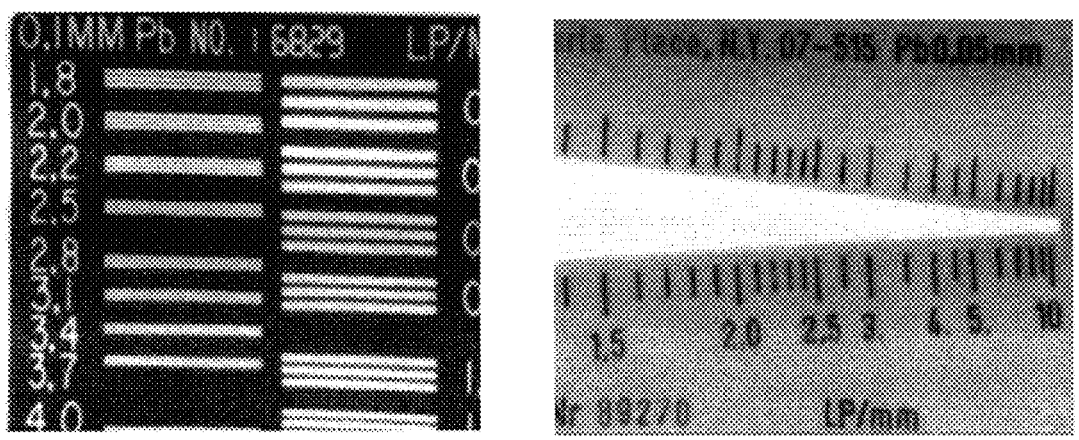
FIG. 7 provides a phantom image taken using a $LaBr_3$:Ce film, according to an embodiment of the present invention.

FIG. 6 also shows spectral analysis of LaBr$_3$:Ce films. As shown the HWE LaBr$_3$:Ce film had a emission peak around channel 828.3 with a relative intensity of 10.27, as compared to a BGO crystal and a commercial LaBr$_3$:Ce crystal, which had a lower relative intensity of 6.63 compared to the BGO crystal. In addition to light yield, a phantom image as shown in FIG. 7 was taken using a 600 micron thick LaBr$_3$:Ce film. The line-pair phantoms were taken at 60 kVp (1 sec., flat field corrected).

The specific dimensions of any of the apparatuses, devices, systems, and components thereof, of the present invention can be readily varied depending upon the intended application, as will be apparent to those of skill in the art in view of the disclosure herein. Moreover, it is understood that the examples and embodiments described herein are for illustrative purposes only and that various modifications or changes in light thereof may be suggested to persons skilled in the art and are included within the spirit and purview of this application and scope of the appended claims. Numerous different combinations of embodiments described herein are possible, and such combinations are considered part of the present invention. In addition, all features discussed in connection with any one embodiment herein can be readily adapted for use in other embodiments herein. The use of different terms or reference numerals for similar features in different embodiments does not necessarily imply differences other than those which may be expressly set forth. Accordingly, the present invention is intended to be described solely by reference to the appended claims, and not limited to the preferred embodiments disclosed herein.

What is claimed is:

1. A method of forming a microcolumnar lanthanum halide scintillator film on a surface of a substrate, the method comprising:
    providing a hot wall evaporation apparatus comprising an evaporation chamber having one or more chamber walls disposed between a positioned substrate and a scintillator source material; and
    depositing a microcolumnar lanthanum halide scintillator film on a surface of the positioned substrate by a process comprising applying heat to the evaporation chamber so as to vaporize scintillator source material for film deposition, wherein applying heat comprises maintaining a temperature relationship of $T_{wall} > T_{source} > T_{substrate}$ for at least a portion of the deposition process, and wherein more than 90% of the deposited scintillator source material is deposited on the substrate surface.

2. The method of claim 1, wherein the source material comprises a main component charge in a first boat and dopant charge in a second boat.

3. The method of claim 2, wherein the main component comprises a lanthanum halide salt and the dopant charge comprises a Ce halide salt.

4. The method of claim 1, wherein the scintillator film comprises a LaBr$_3$:Ce or a LaCl$_3$:Ce composition.

5. The method of claim 1, wherein the scintillator film deposition is performed in a vacuum.

6. The method of claim 1, further comprising forming at least one of a coating of a reflective material, a protective material, or a combination thereof on a surface of the scintillator film.

7. The method of claim 6, wherein the protective material comprises a para-xylylene polymer composition.

8. The method of claim 1, wherein scintillator film deposition is performed in a vacuum and deposition of the reflective material, the protective material, or the combination thereof is performed without breaking the vacuum.

9. A microcolumnar lanthanum halide scintillator film produced by the method of claim 1.

10. The method of claim 1, wherein more than 95% of the deposited scintillator source material is deposited on the substrate surface.

11. A hot wall evaporation apparatus for depositing a microcolumnar lanthanum halide scintillator film on a surface of a substrate, the apparatus comprising:
    an evaporation chamber having a first end with a substrate holder, a second end with one or more scintillator source material boats, and one or more chamber walls at least partially disposed between the first and second ends; and
    a heating system coupled to the evaporation chamber and configured to apply heating to the chamber so as to vaporize a scintillator source material positioned in the one or more boats so as to deposit a microcolumnar lanthanum halide scintillator film on a surface of a substrate positioned in the holder, the applied heating comprising a temperature relationship of $T_{wall} > T_{source} > T_{substrate}$, wherein the hot wall evaporation apparatus is configured to deposit more than 90% of the deposited scintillator source material onto the substrate surface.

12. The apparatus of claim 11, wherein the apparatus is disposed within a vacuum chamber.

13. The apparatus of claim 11, wherein the source material boats comprise a main component charge boat and a dopant charge boat.

14. The apparatus of claim 13, wherein the dopant charge boat extends axially through at least a portion of the main component charge boat.

15. The apparatus of claim 11, wherein the evaporation chamber comprises a quartz cylinder.

16. The apparatus of claim 11, further comprising a substrate-temperature control system coupled to the substrate holder and configured to heat or cool a substrate positioned in the holder.

* * * * *